United States Patent
Ashley et al.

(10) Patent No.: US 6,847,813 B2
(45) Date of Patent: Jan. 25, 2005

(54) RF PRINTED CIRCUIT BOARD CONNECTOR WITH THROUGH-HOLE LEADS

(75) Inventors: Timothy Harold Ashley, Allen, TX (US); Mitchell Johnson, McKinney, TX (US)

(73) Assignee: Samsung Electronics Co., Ltd., Suwon (KR)

(*) Notice: Subject to any disclaimer, the term of this patent is extended or adjusted under 35 U.S.C. 154(b) by 495 days.

(21) Appl. No.: 10/034,773

(22) Filed: Dec. 27, 2001

(65) Prior Publication Data

US 2003/0125071 A1 Jul. 3, 2003

(51) Int. Cl.[7] .............................. H04B 1/28
(52) U.S. Cl. ............ 455/333; 455/280; 455/269; 455/82; 343/702; 343/888; 343/900; 333/12; 333/116; 333/128

(58) Field of Search ................. 455/333, 280, 455/269, 25, 82, 575, 550.1, 90; 343/702, 888, 9, 900; 333/12, 116, 128

(56) References Cited

U.S. PATENT DOCUMENTS

| | | | | |
|---|---|---|---|---|
| 5,630,226 A | * | 5/1997 | Kanda et al. | 455/313 |
| 5,659,889 A | * | 8/1997 | Cockson | 455/575.7 |
| 5,879,168 A | * | 3/1999 | Chan et al. | 439/578 |
| 6,607,400 B1 | * | 8/2003 | Ko | 439/581 |
| 6,611,147 B2 | * | 8/2003 | White et al. | 324/539 |
| 6,614,325 B1 | * | 9/2003 | Kocin | 333/12 |
| 2002/0111185 A1 | * | 8/2002 | Geeraert et al. | 455/550 |

* cited by examiner

Primary Examiner—Nick Corsaro
Assistant Examiner—Phuoc Doan

(57) ABSTRACT

A radio frequency connector that protrudes through a printed circuit board is comprised of threaded leads. A center conductor is shielded when a shielding connector cap, having a threaded inner portion, screws onto the threaded leads.

12 Claims, 5 Drawing Sheets

RF PRINTED CIRCUIT BOARD CONNECTOR WITH THROUGH-HOLE LEADS

TECHNICAL FIELD OF THE INVENTION

The present invention is directed, in general, to radio frequency (RF) communication products and, more specifically, to an RF printed circuit board (PCB) connector for use in the printed circuit boards of mobile station devices and wireless network base stations.

BACKGROUND OF THE INVENTION

As new types of wireless communication devices and new communication services are designed, additional bandwidth must be found in order to implement these devices and service. One method used to fit them into the existing frequency spectrum is to use increasingly higher frequencies.

One of the problems of using higher frequencies is the increased noise problem on printed circuit boards if circuits are not properly shielded. One way that noise can be reduced on printed circuit boards with a radio frequency (RF) connector is to position the end of the conductor flush with the ground plane on the surface of the printed circuit board. An external shield is placed over the center conductor. The shield is then soldered to the backplane of the printed circuit board or bolted to the plate.

This method, however, requires manual labor, external hardware, as well as additional printed circuit board space. All of these problems add additional cost to the price of the component. There is a resulting need in the art for a more economical apparatus and method for shielding radio frequencies on printed circuit boards.

SUMMARY OF THE INVENTION

To address the above-discussed deficiencies of the prior art, it is a primary object of the present invention to reduce the unwanted radiated energy emitted from the center conductor of an RF connector protruding through a printed circuit board (PCB).

The present invention encompasses a radio-frequency (RF) connector for use in a printed circuit board. The connector is comprised of a center conductor that conducts signals at radio frequencies. The center conductor is surrounded by a plurality of leads that extend through the printed circuit board. Each of the plurality of leads has a threaded portion.

A shielding connector cap, with a threaded interior portion, engages the threaded portion of the plurality of leads. The connector cap then shields the noise from the center conductor.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 5, discussed below, and the various embodiments used to describe the principles of the present invention in this patent document are by way of illustration only and should not be construed in any way to limit the scope of the invention. Those skilled in the art will understand that the principles of the present invention may be implemented in any circuit card assembly that handles radio frequency (RF) signals and that contains RF noise sensitive components.

Figure 1:
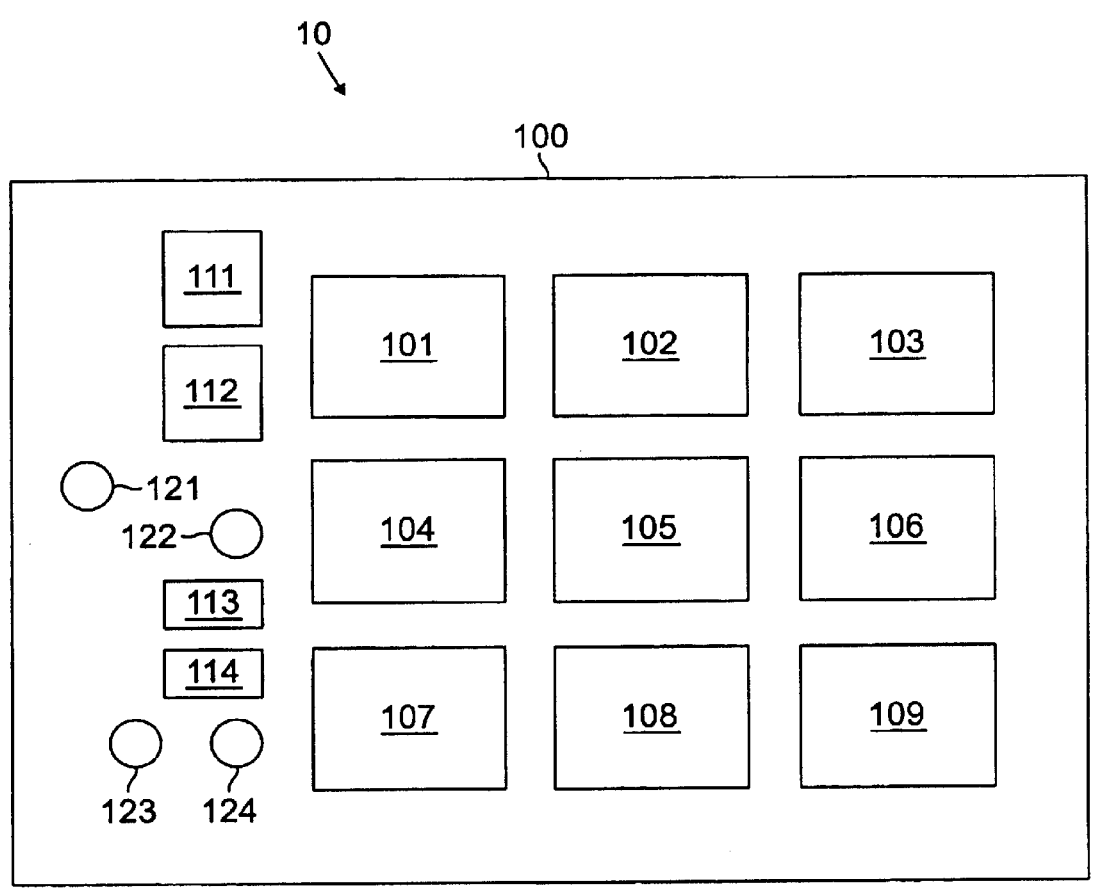
FIG. 1 illustrates an exemplary circuit card assembly containing RF PCB connectors in accordance with the principles of the present invention.

FIG. 1 illustrates exemplary circuit card assembly 10, which contains radio frequency (RF) printed circuit board (PCB) connectors 121–124 in accordance with the principles of the present invention. The exemplary circuit card assembly may be used in, for example, a wireless network base station or in a wireless mobile station device, such as a cellular phone. Circuit card assembly 10 comprises printed circuit board 100, in which integrated circuits 101–109 and discrete circuit components 111–114 are installed. One or more of integrated circuits 101–109 and discrete circuit components 111–114 may be highly susceptible to radio frequency (RF) signals that are radiated by one or more of RF PCB connectors 121–124.

Figure 2:
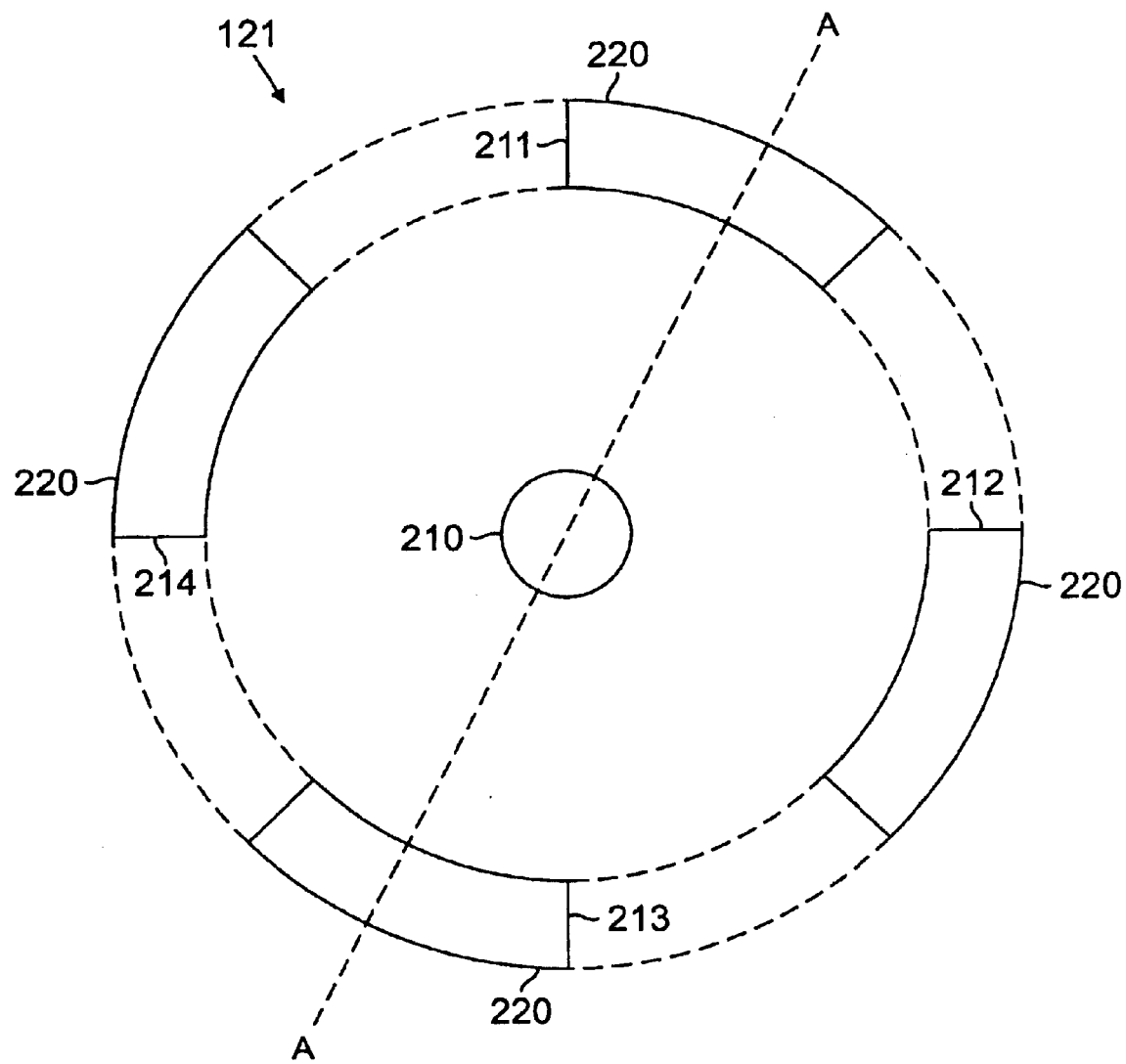
FIG. 2 illustrates a top cross-sectional view of an exemplary RF connector installed in a printed circuit board according to one embodiment of the present invention.

FIG. 2 illustrates a top cross-sectional view of exemplary RF PCB connector 121 that is installed in printed circuit board 100 according to one embodiment of the present invention. Exemplary RF PCB connector 121 comprises four threaded through-board leads 211–214 and center conductor 210. Threads 220 are on the external surfaces of through-board leads 211–214.

Figure 3:
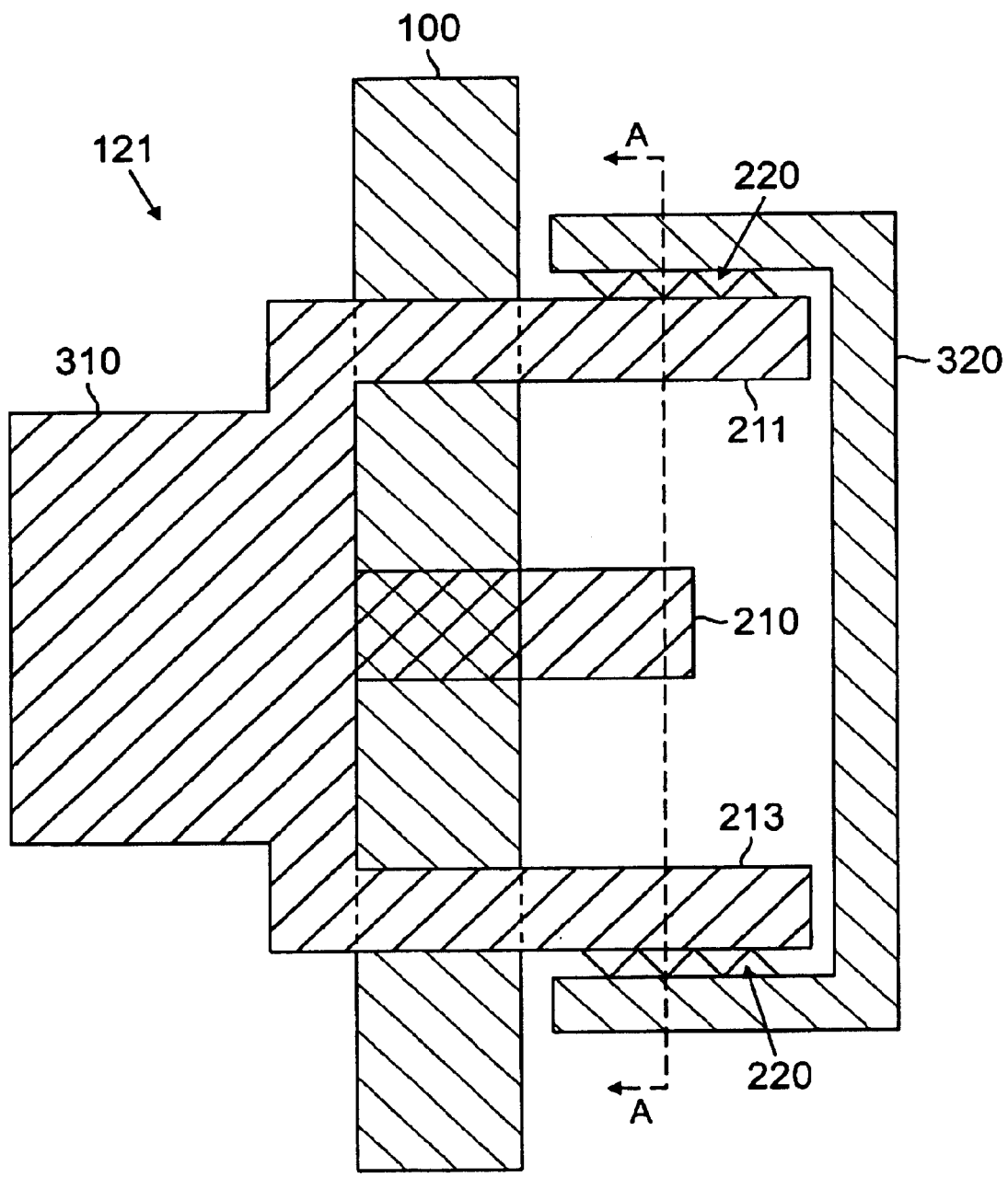
FIG. 3 illustrates a side cross-sectional view of an exemplary RF connector installed in a printed circuit board according to one embodiment of the present invention.

FIG. 3 illustrates a side cross-sectional view of exemplary RF PCB connector 121 that is installed in printed circuit board 100 according to one embodiment of the present invention. The side cross-sectional view is along line A—A in FIG. 2. Exemplary RF PCB connector 121 further comprises shielded lead 310 and connector cap 320.

Connector cap 320 is threaded over the leads once the leads are inserted through printed circuit board 100. The present invention extends center conductor 210 and four through-board leads 211–214, spaced 90° apart, through the thickness of the PCB. Through-board leads 211–214 are threaded on the ends and protrude through printed circuit board 100.

Threads 220 on through-board leads 211–214 extend out the other side of the PCB far enough to fasten connector cap 320 over threads 220 of the leads and shield any noise signal from center conductor 210.

In the preferred embodiment, the number of ground leads was determined based on an operating frequency of 1.96 GHz. The minimum length space required to shield the frequency of 1.96 GHz is 0.30 inch. For a 0.25 inch conductor, four leads are sufficient to provide adequate shielding at the operating frequency.

The RF PCB connector of the present invention is not limited to four threaded leads. Alternate embodiments use other operating frequencies that may require different quantities of threaded leads. For example, a lower operating frequency may require only three leads while a higher operating frequency may require five leads.

The RF PCB connector is also not limited to leads having a plurality of threads. The leads may be comprised of other means for coupling the connector cap to the leads. For example, the leads may have a single ridge over which a ridge or lip on the connector cap slides and engages on a bottom part of the ridge. This can be illustrated in FIG. 3 by removing all but one of the threads on each of the leads and the shielding connector cap.

Figure 4:
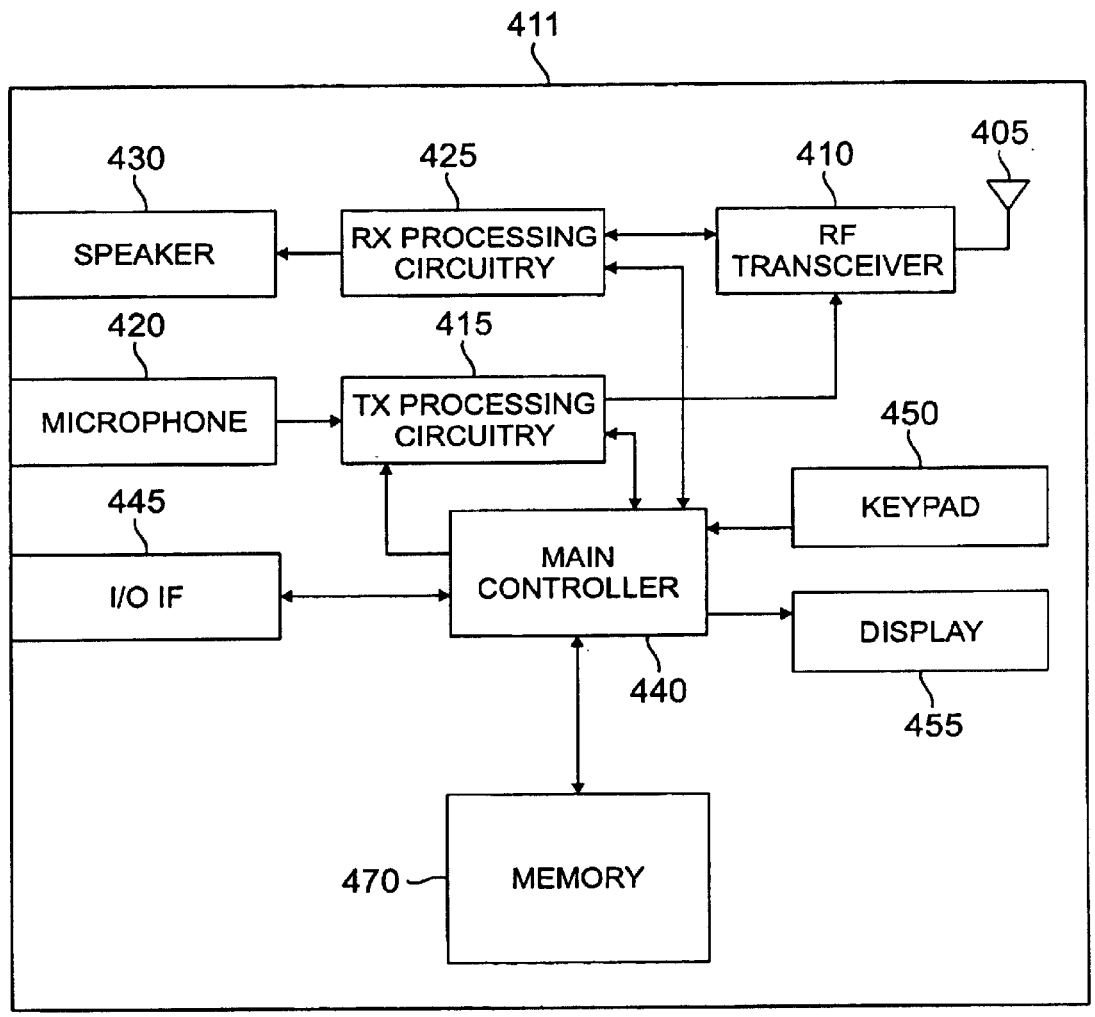
FIG. 4 illustrates an exemplary wireless mobile station in greater detail according to one embodiment of the present invention.
Figure 5:
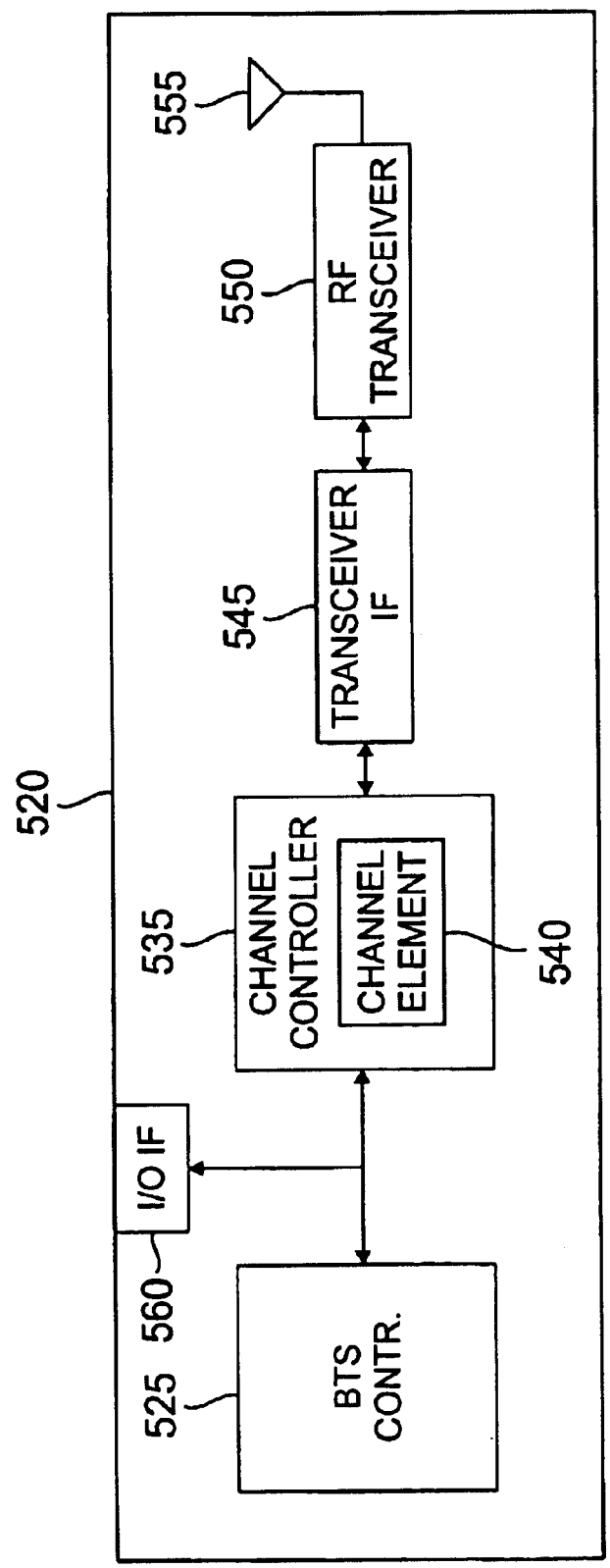
FIG. 5 illustrates a base station transceiver in an exemplary base station according to one embodiment of the present invention.

The RF PCB connector of the present invention can be used in any electronic device requiring an RF connector on a printed circuit board. For example, wireless mobile stations and the networks in which the mobile stations operate use radio frequencies that may cause problems if not properly shielded. FIGS. 4 and 5 illustrate only two such examples of uses of the RF connector.

FIG. 4 illustrates exemplary wireless mobile station 411 according to one embodiment of the present invention. Wireless mobile station 411 comprises antenna 405, radio frequency (RF) transceiver 410, transmitter (TX) processing circuitry 415, microphone 420, receiver (RX) processor circuitry 425, speaker 430, main controller 440, input/output (I/O) interface (IF) 445, keypad 450, and display 455.

Wireless mobile station 411 further comprises memory 470 that stores a basic operating system. Wireless mobile station 111 may be a cell phone, a personal digital assistant (PDA) device equipped with a wireless modem, a two-way pager, a personal communication system (PCS) device, or any other conventional wireless mobile system.

RF transceiver 410 receives, from antenna 405, an incoming RF signal transmitted by a base station of a wireless communication network. RF transceiver 410 down-converts the incoming RF signal to produce an intermediate frequency (IF) or a baseband signal. The RF PCB connector of the present invention may be used in the RF transceiver in order to reduce effects from undesirable radiated energy.

The IF or baseband signal is sent to RX processing circuitry 425 that produces a processed baseband signal by filtering, decoding, and/or digitizing the baseband or IF signal to produce a processed baseband signal. RX processing circuitry 425 transmits the processed baseband signal to speaker 430 (i.e., voice data) or to main controller 440 for further processing (i.e., web browsing).

TX processing circuitry 415 receives analog or digital voice data from microphone 420 or other outgoing baseband data (i.e., web data, e-mail, interactive video game data) from main controller 440. TX processing circuitry 415 encodes, multiplexes, and/or digitizes the outgoing baseband data to produce a processed baseband or IF signal.

RF transceiver 410 receives the outgoing processed baseband or IF signal from TX processing circuitry 415. RF transceiver 410 up-converts the baseband or IF signal to an RF signal that is transmitted via antenna 405.

Main controller 440, in one embodiment, is a microprocessor or microcontroller. Main controller 440 executes basic OS program 271 in order to control the overall operation of wireless mobile station 411. In one such operation, main controller 440 controls the reception of forward channel signals and the transmission of reverse channel signals by RF transceiver 410, RX processing circuitry 425, and TX processing circuitry 415, in accordance with well known principles.

Main controller 440 is also coupled to keypad 450 and display unit 455. Keypad 450 is used by the end-user of the mobile station to enter data into the mobile station. Display 455, in the preferred embodiment, is a liquid crystal display capable of rendering text and/or at least limited graphics from Web sites. Alternate embodiments use other types of displays.

Memory 470 is coupled to main controller 440. Memory 470 may be comprised of solid-state memory such as random access memory (RAM), various types of read only memory (ROM), or Flash RAM. Memory 270 may also include other types of memory such as micro-hard drives or removable media that stores data.

FIG. 5 illustrates a base transceiver station (BTS) 520 according to one embodiment of the present invention. Exemplary BTS 520 comprises BTS controller 525, channel controller 535 that contains channel element 540, transceiver interface (IF) 545, RF transceiver unit 550, and antenna array 555. Input/output interface (I/O IF) 560 couples BTS 520.

BTS controller 525 controls the overall operation of BTS 520 and interfaces with network base station controllers through I/O IF 560. BTS controller 525 directs the operation of channel controller 535. Channel controller 535 contains a number of channel elements such as channel element 540. The channel elements perform bi-directional communications in the forward and reverse links. Depending on the air interface used by system base station, the channel elements engage in time division multiple access (TDMA), frequency division multiple access (FDMA), or code division multiple access (CDMA) communications with the mobile stations in a cell.

Transceiver IF 545 transfers the bi-directional channel signals between channel controller 535 and RF transceiver 550. Transceiver IF 545 converts the radio frequency signal from RF transceiver 550 to an intermediate frequency (IF).

Channel controller 535 then converts this IF to baseband frequency. The RF PCB connector of the present invention may be used in the RF transceiver in order to reduce effects from undesirable radiated energy.

Additionally, RF transceiver 550 may contain an antenna selection unit to select among different antennas in antenna array 255 during both transmit and receive operations. Antenna array 555 is comprised of a number of directional antennas that transmit forward link signals, received from RF transceiver 550, to mobile stations in the sectors covered by the base station. Antenna array 555 also receives reverse link signals from the mobile stations and sends the signals to RF transceiver 550. In a preferred embodiment of the present invention, antenna array 555 is a multi-sector antenna, such as a six-sector antenna, in which each antenna is responsible for transmitting and receiving in a 60_arc of coverage area.

The operation of the mobile station and base transceiver station illustrated in FIGS. 4 and 5 are well known in the art and not discussed further. These figures are for illustration purposes only and do not limit the use of RF PCB connector of the present invention.

In summary, the shielded connector of the present invention reduces the need for complicated external shielding techniques in mechanical designs of printed circuit boards. Threading the leads and attaching a threaded cap to the leads shields the center conductor. This reduces the unwanted radiated energy emitted from the center conductor, thereby increasing the effectiveness of the desired signal.

The present invention allows more flexibility in the placement of noise sensitive components. This is accomplished with no increase to the overall cost of parts and installation of an existing RF connector. In fact, a reduction to the overall cost of the system results from the simpler design.

Although the present invention has been described in detail, those skilled in the art should understand that they can make various changes, substitutions and alterations herein without departing from the spirit and scope of the invention in its broadest form.

What is claimed is:

1. A radio-frequency (RF) connector for use in a printed circuit board, said RF connector comprising:
    a center conductor that conducts signals at radio frequencies;
    a plurality of leads that extend through the printed circuit board, each of the plurality of leads having a threaded portion; and
    a shielding cap having a threaded portion that engages the threaded portion of the plurality of leads.

2. The RF connector as set forth in claim 1 wherein said plurality of leads are spaced 90° apart.

3. The RF connector as set forth in claim 1 wherein said threaded portion of said plurality of leads encircle the exterior of said plurality of leads and said threaded portion of said shielding cap encircle the interior of said shielding cap.

4. A radio-frequency (RF) connector for use in a printed circuit board, said RF connector comprising:
    a center conductor that conducts signals at radio frequencies;
    a plurality of leads that extend through the printed circuit board, each of the plurality of leads having at least one ridge extending from each of said plurality of leads; and
    a shielding cap having a lip portion that engages said ridge portion of the plurality of leads.

5. The RF connector as set forth in claim 4 wherein said plurality of leads are spaced 90° apart.

6. The RF connector as set forth in claim 4 wherein said ridge on each of said plurality of leads encircles the exterior of said plurality of leads and said lip portion of said shielding cap encircles the interior of said shielding cap.

7. A wireless mobile station comprising:
    at least one circuit card assembly comprising a printed circuit board having a plurality of integrated circuit chips disposed thereon;
    a radio-frequency (RF) connector for use on said printed circuit board, the RF connector comprising:
        a center conductor that conducts signals at radio frequencies;
        a plurality of leads that extend through the printed circuit board, each of the plurality of leads having a threaded portion; and
        a shielding cap having a threaded portion that engages the threaded portion of the plurality of leads.

8. The wireless mobile station as set forth in claim 7 wherein said plurality of leads are spaced 90° apart.

9. The wireless mobile station as set forth in claim 7 wherein said threaded portion of said plurality of leads encircle the exterior of said plurality of leads and said threaded portion of said shielding cap encircle the interior of said shielding cap.

10. A base transceiver station for use in a wireless network, said base transceiver station comprising:
    at least one circuit card assembly comprising a printed circuit board having a plurality of integrated circuit chips disposed thereon;
    a radio-frequency (RF) connector for use on said printed circuit board, the RF connector comprising:
        a center conductor that conducts signals at radio frequencies;
        a plurality of leads that extend through the printed circuit board, each of the plurality of leads having a threaded portion; and
        a shielding cap having a threaded portion that engages the threaded portion of the plurality of leads.

11. The base transceiver station as set forth in claim 10 wherein said plurality of leads are spaced 90° apart.

12. The base transceiver station as set forth in claim 10 wherein said threaded portion of said plurality of leads encircle the exterior of said plurality of leads and said threaded portion of said shielding cap encircle the interior of said shielding cap.

* * * * *